United States Patent
Chen et al.

(10) Patent No.: US 8,951,838 B2
(45) Date of Patent: Feb. 10, 2015

(54) LOW COST AND ULTRA-THIN CHIP ON WAFER ON SUBSTRATE (COWOS) FORMATION

(71) Applicant: Taiwan Semiconductor Manufacturing Company, Ltd., Hsin-Chu (TW)

(72) Inventors: Hsin-Yu Chen, Taipei (TW); Lin-Chih Huang, Wuri Township (TW); Tasi-Jung Wu, Hsin-Chu (TW); Tsang-Jiuh Wu, Hsin-Chu (TW); Wen-Chih Chiou, Miaoli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/830,570

(22) Filed: Mar. 14, 2013

(65) Prior Publication Data
US 2014/0264834 A1    Sep. 18, 2014

(51) Int. Cl.
*H01L 21/44* (2006.01)
*H01L 23/00* (2006.01)

(52) U.S. Cl.
CPC ............. *H01L 24/20* (2013.01); *H01L 24/19* (2013.01); *H01L 24/82* (2013.01)
USPC .......................................... 438/107; 438/637

(58) Field of Classification Search
USPC .................................................. 438/107, 637
See application file for complete search history.

(56) References Cited

U.S. PATENT DOCUMENTS

| | | | |
|---|---|---|---|
| 2011/0198589 A1* | 8/2011 | Lin et al. | 257/48 |
| 2014/0061924 A1 | 3/2014 | Chen et al. | |

* cited by examiner

*Primary Examiner* — Long Pham
(74) *Attorney, Agent, or Firm* — Slater & Matsil, L.L.P.

(57) ABSTRACT

Methods of making and an integrated circuit device. An embodiment method includes patterning a first polymer layer disposed over a first copper seed layer, electroplating a through polymer via in the first polymer layer using the first copper seed layer, a via end surface offset from a first polymer layer surface, forming a second polymer layer over the first polymer layer, the second polymer layer patterned to expose the via end surface, and electroplating an interconnect in the second polymer layer to cap the via end surface using a second copper seed layer.

20 Claims, 7 Drawing Sheets

LOW COST AND ULTRA-THIN CHIP ON WAFER ON SUBSTRATE (COWOS) FORMATION

BACKGROUND

A beneficial technology for three-dimensional (3D) integration employs vertical interconnects known as through silicon vias (TSVs). The TSVs may be formed using, for example, a via-first process or a via-middle process. In the via-first process, the TSVs are generally formed prior to complementary metal-oxide-semiconductor (CMOS) process and in the via-middle process the TSVs are generally formed in between the CMOS process and back-end-of line (BEOL) process.

Unfortunately, forming TSVs using either the via-first process or the via-middle process can be challenging and costly. Because of the high cost, improvements in 3D integration technology continue to be sought.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely a Chip on Wafer on Substrate (CoWoS) device. The disclosure may also be applied, however, to other integrated circuits, electronic structures, and the like.

Figure 1:
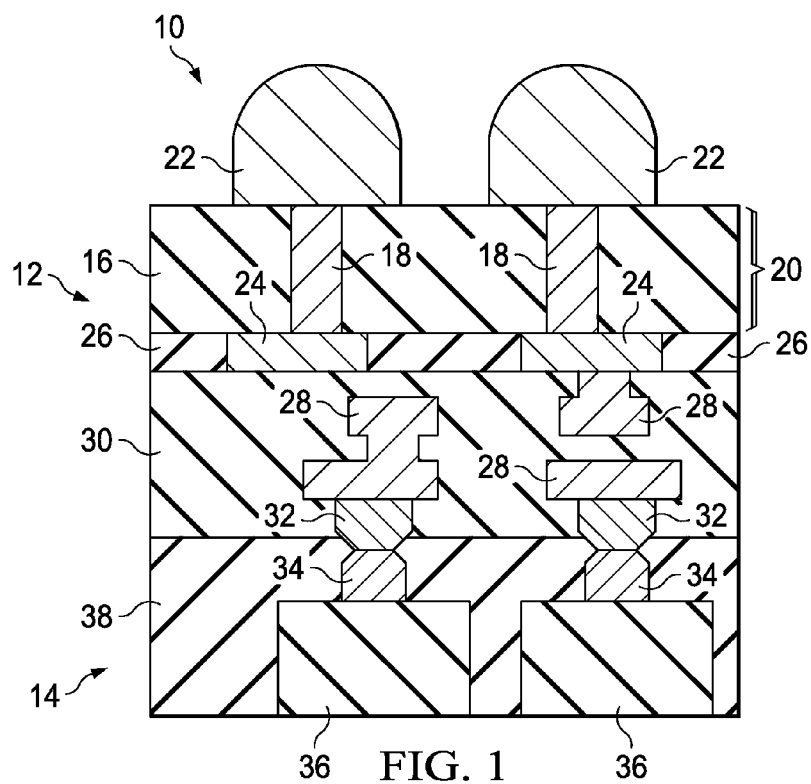
FIG. 1 is an embodiment Chip on Wafer on Substrate (CoWoS) device.

Referring now to FIG. 1, an embodiment CoWoS device 10 is illustrated. As shown, the CoWoS device 10 generally comprises a chip 12 mounted to an integrated package 14. The chip 12 includes a first polymer layer 16 having at least one through polymer via (TPV) 18 therein. In an embodiment, the first polymer layer 16 has a thickness 20 of less than about twenty micrometers (20 μm). Each of the through polymer vias 18 extends between a conductive bump 22 (e.g., a C4 bump formation) and a copper interconnect 24 disposed in a second polymer layer 26.

For the purpose of reference, the copper interconnect 24 and the second polymer layer 26 may be referred to as a first metallization layer (a.k.a., Mz). In an embodiment, one or both of the first polymer layer 16 and the second polymer layer 26 is a photosensitive polymer such as polyimide (PI), polybenzoxazole (PBO), bis-benzocyclobutene (BCB), spin-on glass (SOG), and other suitable polymers. In an embodiment, the first polymer layer 16 and/or the second polymer layer 26 may be formed by a lithography method including coating, exposure, develop, curing, and descum.

Still referring to FIG. 1, the copper interconnects 24 in the first polymer layer 16 are generally in electrical communication with subsequent copper interconnects 28 or other metallization in subsequent polymer layers 30. In an embodiment, the subsequent polymer layers 30 are a photosensitive polymer such as polyimide (PI), polybenzoxazole (PBO), bis-benzocyclobutene (BCB), spin-on glass (SOG), and other suitable polymers. In an embodiment, the subsequent polymer layers 30 are formed as described in co-pending application U.S. Ser. No. 13/601,265 entitled "Interconnect Structure and Method" filed on Aug. 31, 2012, which is incorporated herein by reference.

For the purpose of reference, the subsequent copper interconnects 28 and the subsequent polymer layers 30 may be referred to as a second and third metallization layers (a.k.a., M2, M3). In an embodiment, the first polymer layer 16, the second polymer layer 26, and the subsequent polymer layers 30 are each formed from the same or similar polymer material.

As shown, the subsequent copper interconnects 28 are generally in electrical communication with microbumps 32 (a.k.a., μ-bumps) in the chip 12. In an embodiment, the microbumps 32 are formed from copper (Cu), gold (Au), solder, nickel (Ni), tin/silver (SnAg) an Electroless Nickel-Electroless Palladium-Immersion Gold (ENEPIG), or another suitable microbump material. In an embodiment, the microbumps 32 are formed from electroplating or electroless plating.

Still referring to FIG. 1, the microbumps 32 of the chip 12 are in electrical communication with corresponding microbumps 34 or pads in the integrated package 14. As shown in FIG. 1, in addition to the corresponding microbumps 34 the integrated package 14 also includes one or more dies 36 secured in a die mold 38. It should be recognized that practical applications of the embodiment CoWoS device 10 may also include other features, structures, layers, connections, and so on that have not been included in FIG. 1 for ease of illustration.

As will be more fully explained below, the embodiment CoWoS device 10 is free of any interlayer between the first polymer layer 16 and the second polymer layer 26. Still in another embodiment, the CoWoS device 10 is free of any isolation layer on sidewalls of the through polymer via 18 passing through the first polymer layer 16. In an embodiment, the CoWoS device 10 includes one or both of the interlayer and the isolation layer. In addition, the through polymer via 18 in the first polymer layer 16 is formed without using or relying on wafer thinning, an etching process, or a chemical vapor deposition (CVD) process.

Figure 2A:
FIGS. 2A-2H collectively illustrate a process flow for forming the embodiment CoWoS device of FIG. 1.

Referring to FIGS. 2A-2H, a process flow for forming the embodiment CoWoS device 10 of FIG. 1 is collectively illustrated. As shown in FIG. 2A, a first copper seed layer 40 is formed over a conversion film 42 or other adhesive temporarily supported by a carrier 44. In an embodiment, the first copper seed layer 40 is any type copper seed formed by physical vapor deposition (PVD) copper (Cu), electroless Cu, laminate Cu, and so on. In an embodiment, a tantalum (Ta), tantalum nitride (TaN), or titanium (Ti) may be used as a barrier layer during formation of the first copper seed layer 40. In an embodiment, the conversion film 42 is a light-to-heat conversion release coating. In an embodiment, the carrier 44 is formed from glass, ceramic, silicon carbide (SiC), or other suitable carrier materials.

Figure 2B:
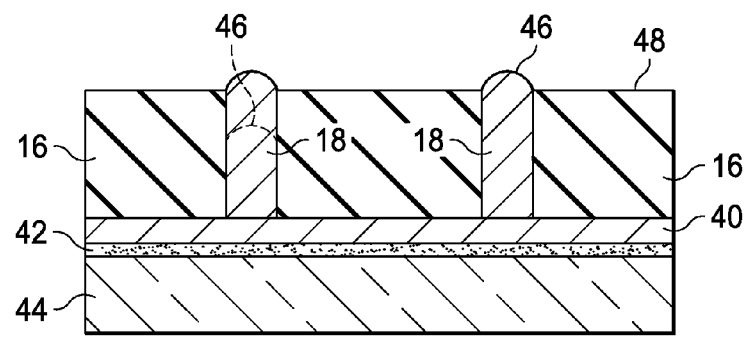

As shown in FIG. 2B, the first polymer layer 16 is disposed over the first copper seed layer 40 and then patterned. Thereafter, an electroplating process is performed to generate the through polymer via 18 in the first polymer layer 16 using the first copper seed layer 40. The sidewalls of the plated copper in the through polymer via 18 are free of any isolation layer. In other words, the plated copper of the through polymer via 18 engages the polymer of the first polymer layer 16.

Still referring to FIG. 2B, a via end surface 46 is generally offset from a polymer layer surface 48 adjacent thereto. In an embodiment, the via end surface 46 projects or is disposed above the polymer layer surface 48 as oriented in FIG. 2B. In another embodiment, the via end surface 46 is disposed below the polymer layer surface 48 (as represent by the dashed lines). In other words, the via end surface 46 may extend beyond the polymer layer surface 48 or generally reside beneath the first polymer layer 16 depending on, for example, the extent of the plated copper used to form the through polymer via 18.

Figure 2C:
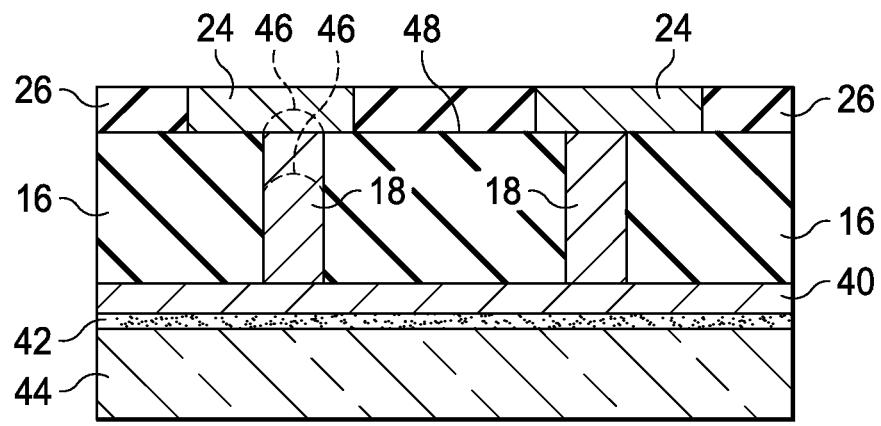

Referring now to FIG. 2C, the second polymer layer 26 is formed over the first polymer layer 16 and then patterned. As show, the second polymer layer is patterned to expose the via end surface 46 of each of the through polymer vias 18. After the patterning is performed, a single damascene electroplating process is performed to form the copper interconnect 24. In that regard, and as shown in detail in FIGS. 3-4, a second copper seed layer 50 is used in the process. In an embodiment, the second copper seed layer 50 is formed by physical vapor deposition (PVD) copper (Cu). In an embodiment, a tantalum (Ta), tantalum nitride (TaN), or titanium (Ti) may be used as a barrier layer during formation of the second copper seed layer 50.

Figure 2D:
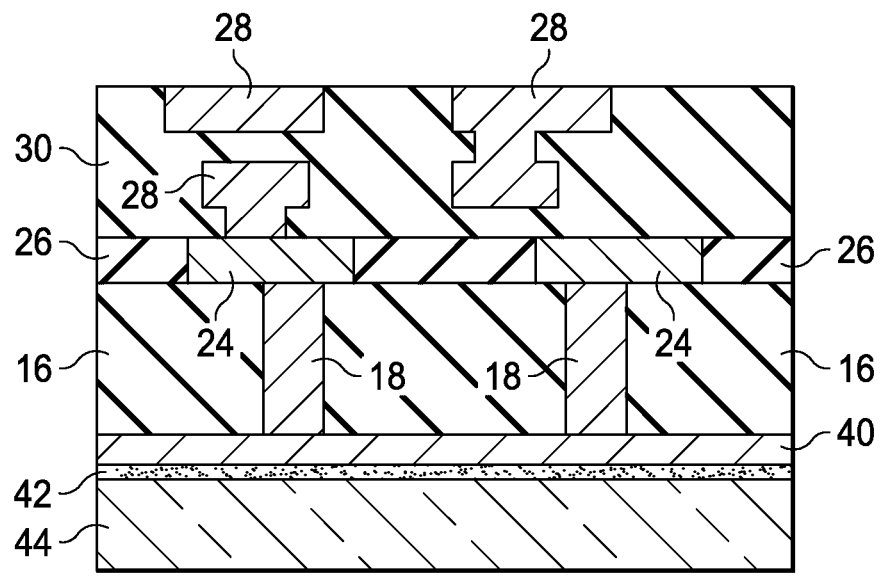
Figure 2E:
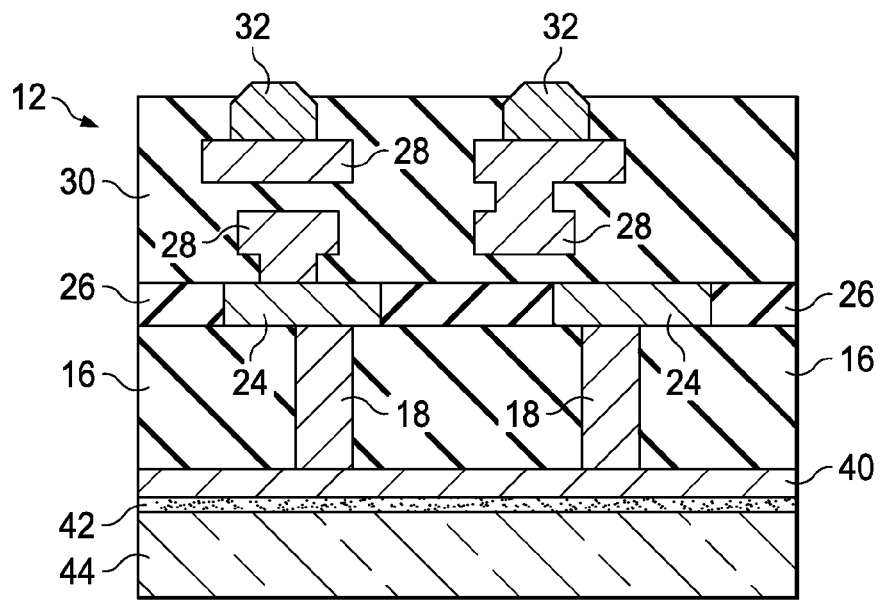

Referring now to FIG. 2D, the subsequent polymer layers 30 and subsequent copper interconnects 28 are also formed using a single damascene electroplating process. After a suitable number of metallization layers are formed, the microbumps 32 may be formed as shown in FIG. 2E. As shown, the microbumps 32 are supported by one of the subsequent polymer layers 30 and are in electrical communication with the subsequent interconnects 28.

Figure 2F:
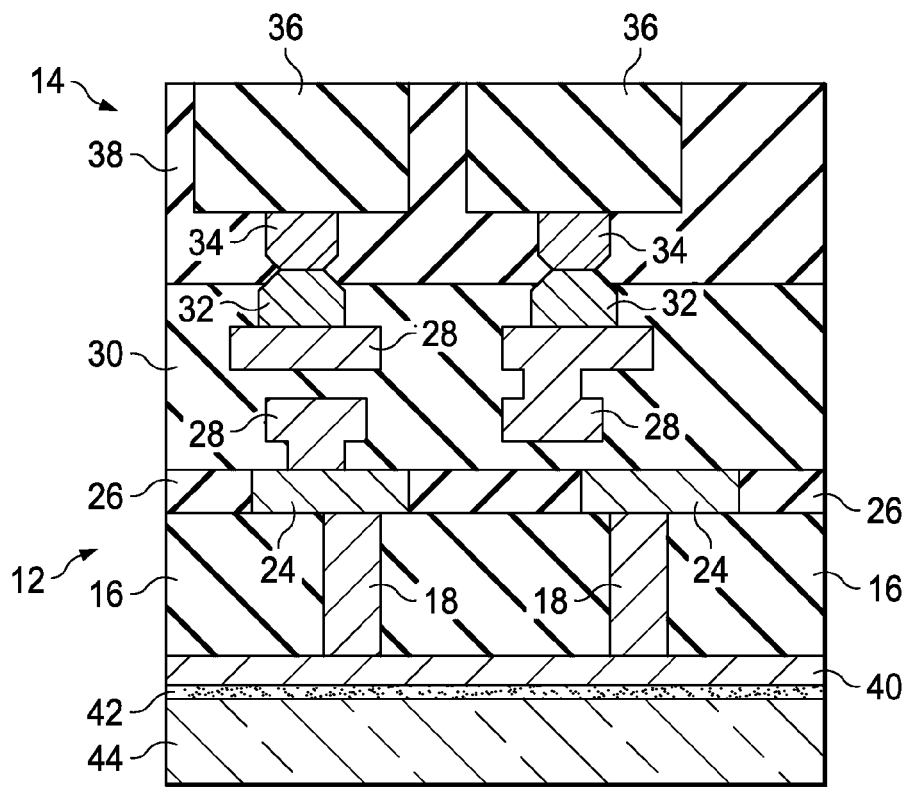
Figure 2G:
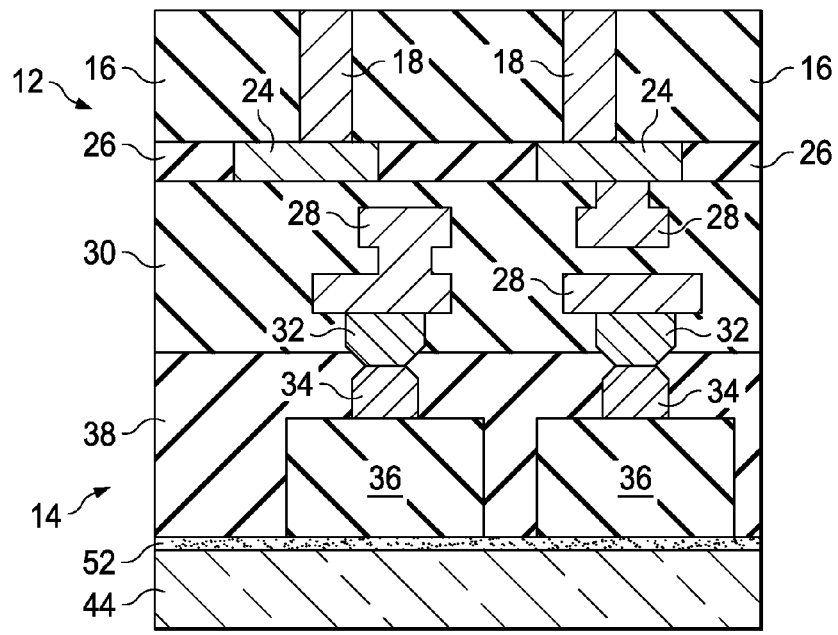

Referring now to FIG. 2F, the integrated package 14 with the dies 36 is mounted to the chip 12 using the corresponding microbumps 34. Next, as shown in FIG. 2G, the carrier 44 is removed and then rebounded to the integrated package 14. In an embodiment, the carrier 44 is a glass carrier and the conversion film 42 is a light-to-heat conversion release coating. As such, the carrier 44 is removed by applying ultraviolet (UV) light to the light-to-heat conversion release coating. In an embodiment, the glass carrier 44 is re-bonded as shown in FIG. 2G using a die attach film 52. By migrating the carrier 44 to an opposing side, the through polymer vias 18 in the first polymer layer 16 are revealed.

Figure 2H:
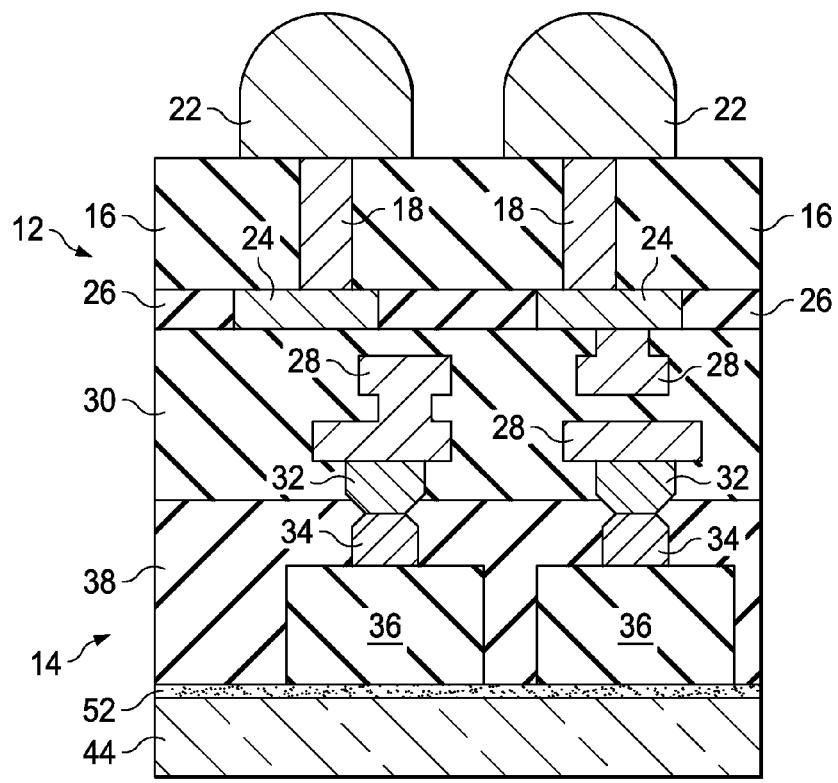

Referring now to FIG. 2H, after the through polymer vias 18 have been exposed the conductive bumps 22 are formed on the chip 12. The conductive bumps 22 may be formed from copper, solder, nickel, or another conductive material. As shown, the conductive bumps 22 are in electrical communication with the through polymer vias 18. After the conductive bumps 22 have been formed, the glass carrier 44 and the die attach film 52 are removed to generate the embodiment CoWoS device 10 in FIG. 1.

Figure 3:
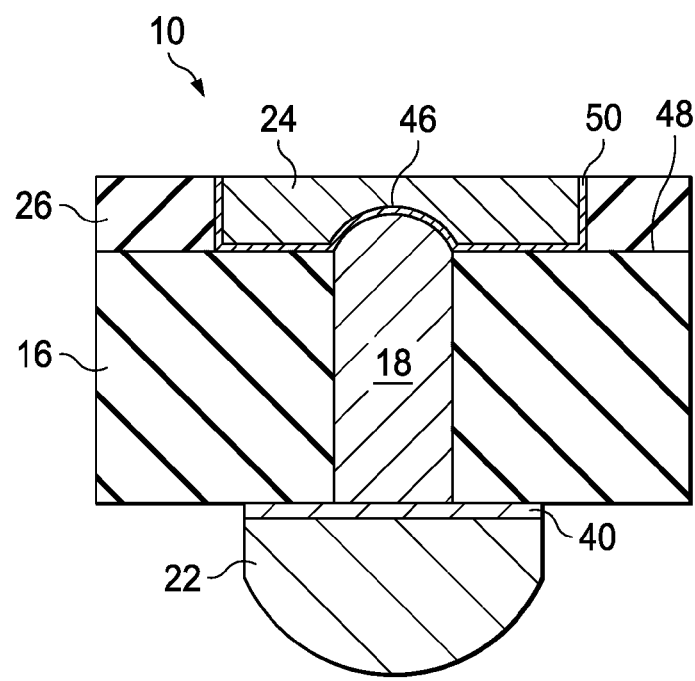
FIG. 3 illustrates a representative portion of an embodiment CoWoS device where an exterior surface of the through polymer via (TPV) extends beyond a top surface of the polymer layer.

Referring now to FIG. 3, a representative portion of an embodiment CoWoS device 10 is depicted. As shown, the via end surface 46 of the through polymer via 18 extends beyond the top surface of the first polymer layer 16. Moreover, the second copper seed layer 50 (a.k.a., barrier seed layer) used to form the copper interconnect 24 in the second polymer layer 26 is disposed over the via end surface 46, a portion of the first polymer layer 16, and sidewalls of the second polymer layer 26. In addition, a portion of the first copper seed layer 40 used to form the through polymer via 18 is generally interposed between the conductive bump 22 and the through polymer via 18 and the conductive bump 22 and a portion of the first polymer layer 16.

Figure 4:
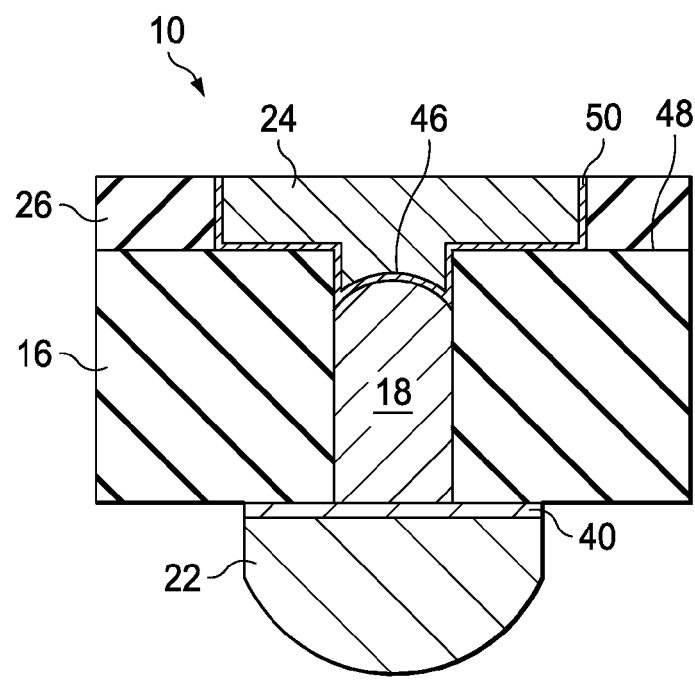
FIG. 4 illustrates a representative portion of an embodiment CoWoS device where an exterior surface of the through polymer via (TPV) extends beyond a top surface of the polymer layer.

Referring now to FIG. 4, a representative portion of an embodiment CoWoS device 10 is depicted. As shown, the via end surface 46 of the through polymer via 18 is disposed below the top surface of the polymer layer 50. Therefore, the second copper seed layer 50 (a.k.a., barrier seed layer) used to form the copper interconnect 24 in the second polymer layer 26 is disposed over the via end surface 46, a portion of the first polymer layer 16, sidewalls of the first polymer layer 16, and sidewalls of the second polymer layer 26. In addition, a portion of the first copper seed layer 40 used to form the through polymer via 18 is generally interposed between the conductive bump 22 and the through polymer via 18 and the second conductive bump 22 and a portion of the first polymer layer 16.

As shown in FIGS. 3-4, the representative portion of the embodiment CoWoS device 10 is free of any interlayer between the first polymer layer 16 and the second polymer layer 26. Moreover, the embodiment CoWoS device 10 is free of any isolation layer on sidewalls of the through polymer via 18 passing through the first polymer layer 16. In addition, the through polymer via 18 in the first polymer layer 16 is formed without using or relying on wafer thinning, etching, or a chemical vapor deposition (CVD) process.

Figure 5:
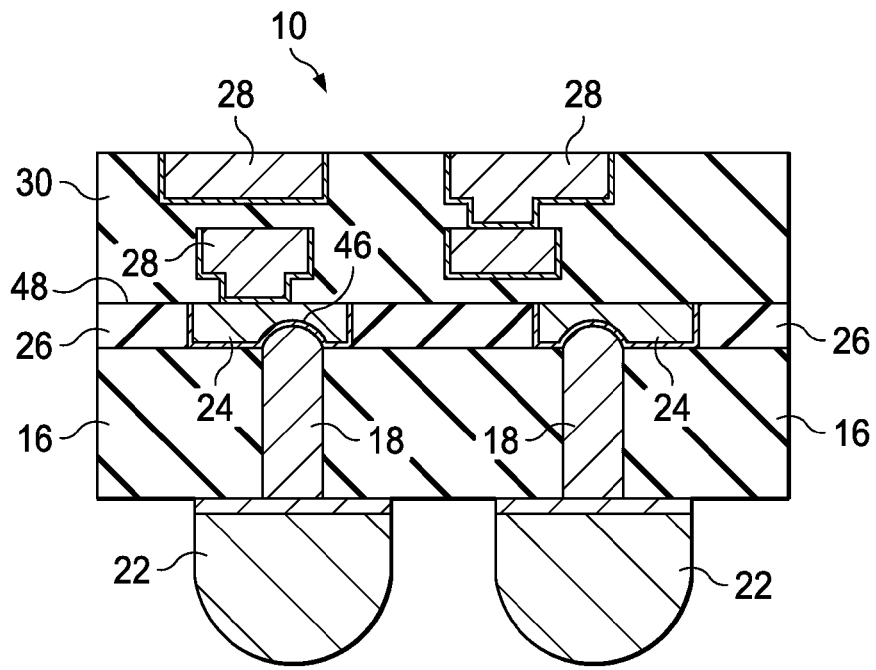
FIG. 5 illustrates an embodiment CoWoS device where an exterior surface of the through polymer via (TPV) extends beyond a top surface of the polymer layer.
Figure 6:
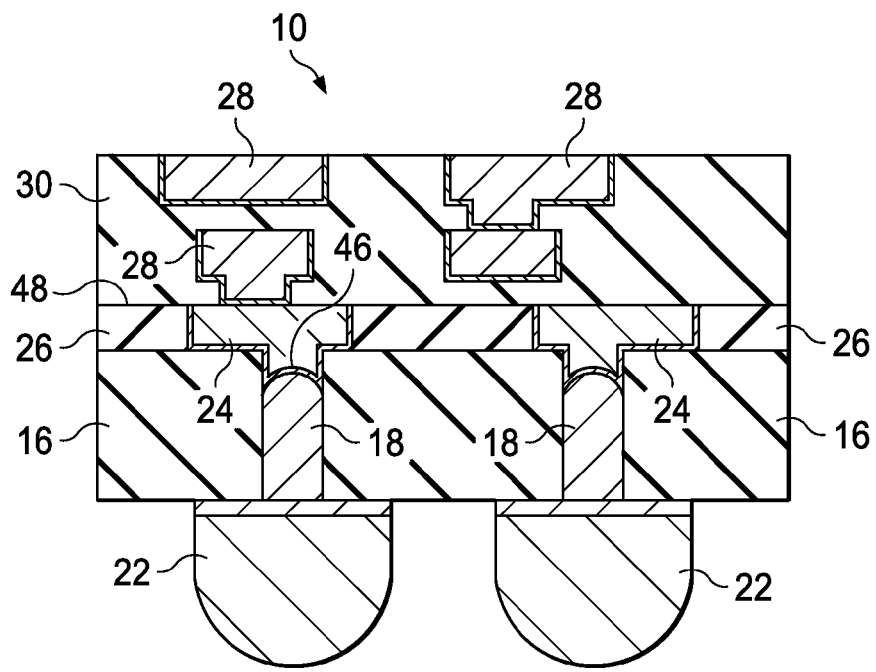
FIG. 6 illustrates an embodiment CoWoS device where an exterior surface of the through polymer via (TPV) resides below a top surface of the polymer layer.

Referring now to FIGS. 5-6, a representative portion of the embodiment CoWoS device 10 is depicted. As shown in FIG. 5, the via end surface 46 of the through polymer via 18 extends beyond the polymer layer surface 48. In contrast, as shown in FIG. 6 the via end surface 46 of the through polymer via 18 does not extend beyond the top surface of the polymer layer surface 48.

Figure 7:
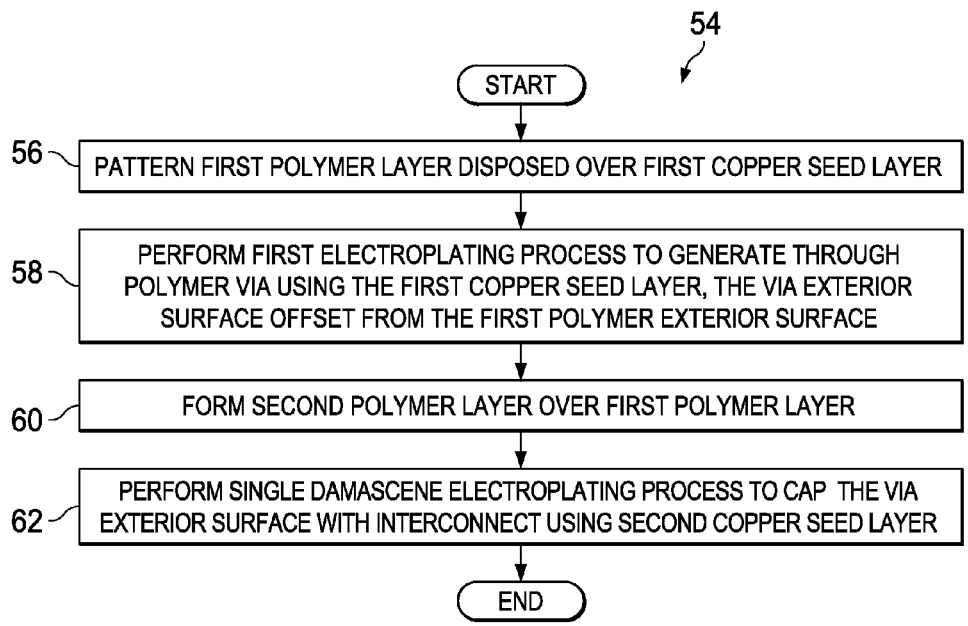
FIG. 7 illustrates an embodiment method of forming the embodiment CoWoS device of FIG. 1.

Referring now to FIG. 7, an embodiment method 54 of forming the CoWoS device 10 of FIG. 1 is illustrated. In block 56, a first polymer layer disposed over a first copper seed layer is patterned. In block 58, a first electroplating process is performed to generate a through polymer via in the first polymer layer using the first copper seed layer. In block 60, a second polymer layer is formed over the first polymer layer. The second polymer layer is patterned to expose the via end surface. In block 62, a single damascene electroplating process is performed to cap the via end surface with an interconnect using a second copper seed layer.

Figure 8:
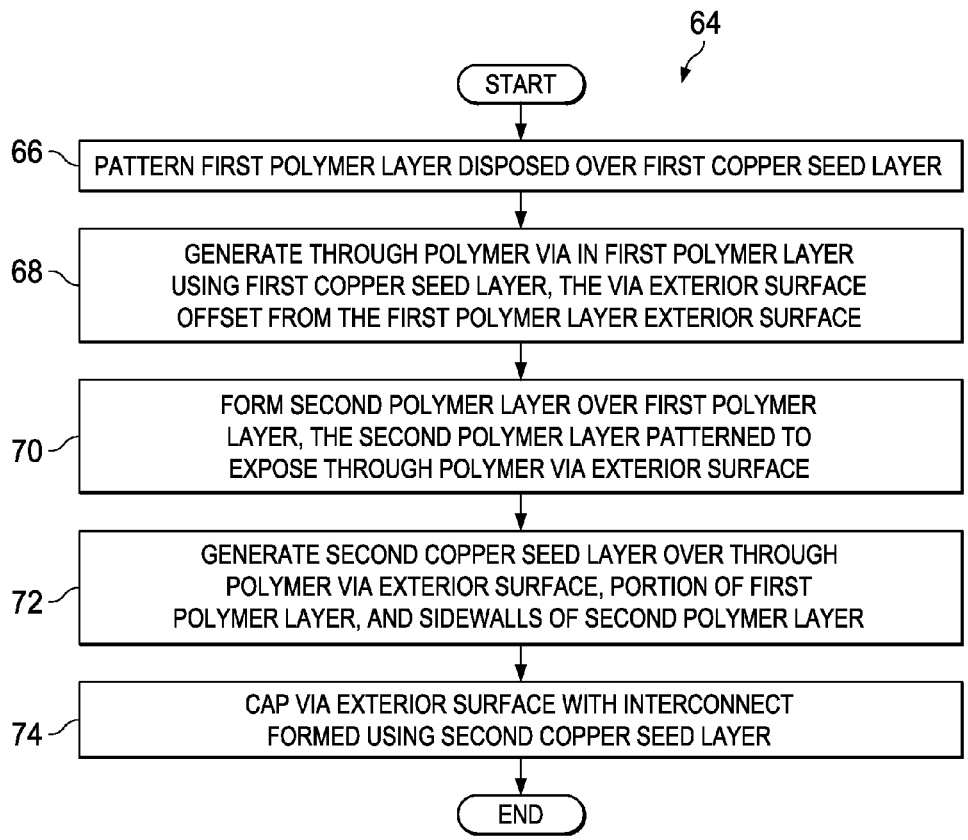
FIG. 8 illustrates an embodiment method of forming the embodiment CoWoS device of FIG. 1.

Referring now to FIG. 8, an embodiment method 64 of forming the CoWoS device 10 of FIG. 1 is illustrated. In block 66, a first polymer layer disposed over a first copper seed layer is patterned. In block 68, a through polymer via is generated in the first polymer layer using the first copper seed layer. The via end surface is offset from a first polymer layer surface. In block 70, a second polymer layer is formed over the first polymer layer. The second polymer layer is patterned to expose the via end surface. In block 72, a second copper seed layer is generated over the through polymer via end surface, a portion of the first polymer layer, and sidewalls of the second polymer layer. In block 74, the via end surface is capped with an interconnect formed using the second copper seed layer.

From the foregoing, it should be recognized that the CoWoS 10 device and process of forming the same offer significant advantages. For example, the embodiment CoWoS device 10 is free of any interlayer between the first polymer layer 16 and the second polymer layer 26. Moreover, the embodiment CoWoS device 10 is free of any isolation layer on sidewalls of the through polymer via 18 passing through the first polymer layer 16. In addition, the through polymer via 18 in the first polymer layer 16 is formed without using or relying on wafer thinning, etching, or a chemical vapor deposition (CVD) process.

Because process steps and/or layers have been eliminated, the embodiment CoWoS device 10 may be manufactured for about forty-seven percent (47%) less than when conventional processes are used. Moreover, a low k material may be utilized in the fabrication process along with an ultra-thin scheme to ensure that the embodiment CoWoS device 10 provides high-performance. Indeed, the CoWoS device 10 disclosed herein is a cost effective and high performance ultra-thin CoWoS.

An embodiment method of forming an integrated circuit includes patterning a first polymer layer disposed over a first copper seed layer, performing a first electroplating process to generate a through polymer via in the first polymer layer using the first copper seed layer, a via end surface offset from a first polymer layer surface, forming a second polymer layer over the first polymer layer, the second polymer layer patterned to expose the via end surface, and performing a single damascene electroplating process to cap the via end surface with an interconnect using a second copper seed layer An embodiment method of forming an integrated circuit includes patterning a first polymer layer disposed over a first copper seed layer, generating a through polymer via in the first polymer layer using the first copper seed layer, a via end surface offset from a first polymer layer surface, forming a second polymer layer over the first polymer layer, the second polymer layer patterned to expose the through polymer via end surface, generating a second copper seed layer over the through polymer via end surface, a portion of the first polymer layer, and sidewalls of the second polymer layer, and capping the via end surface with an interconnect formed using the second copper seed layer.

An integrated circuit device includes a copper via in a first polymer layer, the copper via having a first via end surface offset from the first polymer layer, a second polymer layer disposed over the first polymer layer, the second polymer layer patterned to expose the first via exterior surface, a first copper seed layer disposed on the first via end surface, and a first portion of the first polymer layer, and sidewalls of the second polymer layer, a plated copper interconnect disposed over the first copper seed layer, a second copper seed layer disposed on a second via end surface and a second portion of the first polymer layer, and a bump disposed on the second copper seed layer.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of forming an integrated circuit, comprising:
   forming a first conductive seed layer;
   after the forming the first conductive seed layer, patterning a first polymer layer disposed over the first conductive seed layer;
   electroplating a through polymer via in the first polymer layer using the first conductive seed layer, a via end surface offset from an uppermost surface of the first polymer layer;
   forming a second polymer layer over the first polymer layer, the second polymer layer patterned to expose the via end surface; and
   forming an interconnect over the via end surface.

2. The method of claim 1, further comprising offsetting the via end surface vertically above the uppermost surface.

3. The method of claim 1, further comprising offsetting the via end surface vertically below the uppermost surface.

4. The method of claim 1, further comprising forming a second conductive seed layer on exposed surfaces of the second polymer layer.

5. The method of claim 1, further comprising repeating the forming an interconnect to form subsequent interconnects in subsequent polymer layers.

6. The method of claim 5, further comprising forming microbumps in one of the subsequent polymer layers, the microbumps electrically coupled to one of the subsequent interconnects.

7. The method of claim 6, further comprising bonding the microbumps to corresponding microbumps on an integrated package, the integrated package including one or more dies.

8. The method of claim 7, further comprising applying ultraviolet light to a release coating disposed between the first conductive seed layer and a carrier to remove the carrier and then bonding the carrier to the integrated package.

9. The method of claim 8, further comprising forming a bump in electrical communication with the through polymer via on a side of the first polymer layer opposite the interconnect.

10. The method of claim 1, wherein the first conductive seed layer is disposed on a light-to-heat conversion release coating supported by a carrier.

11. A method of forming an integrated circuit, comprising:
    forming a first seed layer over a substrate;
    forming, after the forming the first seed layer, a first polymer layer over the first seed layer;
    patterning the first polymer layer;
    electroplating a through polymer via in the first polymer layer using the first seed layer, a via end surface offset from an uppermost surface of the first polymer layer;
    forming a second polymer layer over the first polymer layer, the second polymer layer patterned to expose at least the via end surface;
    depositing a second seed layer over the via end surface, a portion of the first polymer layer, and sidewalls of the second polymer layer; and electroplating an interconnect, using the second seed layer, on the via end surface.

12. The method of claim 11, wherein the via end surface extends beyond the first polymer layer.

13. The method of claim 11, wherein the via end surface is within the first polymer layer.

14. The method of claim 11, further comprising performing a chemical mechanical polishing process to planarize the interconnect and to remove portions of the second seed layer disposed over the first polymer layer.

15. The method of claim 14, further comprising depositing a barrier layer between the second polymer layer and the second seed layer.

16. A method of forming an integrated circuit, comprising:
providing a carrier substrate;
forming a release layer over the carrier substrate;
forming a first polymer layer over the release layer;
forming a through polymer via in the first polymer layer such that a via end surface is offset from an uppermost surface of the first polymer layer, the through polymer via free of any isolation layer on sidewalls of the through polymer via;
forming a second polymer layer over the first polymer layer;
patterning the second polymer layer to expose at least the via end surface;
forming an interconnect over the via end surface exposed by the patterning of the second polymer layer; and
removing the carrier substrate.

17. The method of claim 16, wherein the via end surface is offset vertically above the uppermost surface.

18. The method of claim 16, wherein the via end surface is offset vertically below the uppermost surface.

19. The method of claim 16, wherein at least one of the through polymer via and the interconnect is formed by an electroplating process.

20. The method of claim 16, wherein the release layer is a light-to-heat conversion release coating.

* * * * *